(12) United States Patent
Leger

(10) Patent No.: US 6,313,628 B1
(45) Date of Patent: Nov. 6, 2001

(54) DEVICE FOR MEASURING COMPONENTS OF A MAGNETIC FIELD WITH THE AID OF A SCALAR MAGNETOMETER

(75) Inventor: Jean-Michel Leger, Villard Bonnol (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/314,113

(22) Filed: May 19, 1999

(30) Foreign Application Priority Data

Jun. 9, 1998 (FR) .................................................. 98 07216

(51) Int. Cl.$^7$ ...................................................... G01V 3/00
(52) U.S. Cl. .............................................................. 324/300
(58) Field of Search ...................................... 324/300, 302, 324/304

(56) References Cited

U.S. PATENT DOCUMENTS

| 4,814,707 | 3/1989 | Marton ................................. 324/304 |
| 5,245,280 | * 9/1993 | Beranger et al. ..................... 324/302 |

FOREIGN PATENT DOCUMENTS

| 0 462 001 | 12/1991 | (EP) . |
| 0 616 228 | 9/1994 | (EP) . |

* cited by examiner

Primary Examiner—Christine Oda
Assistant Examiner—Dixomara Vargas

(57) ABSTRACT

A device for measuring components of a magnetic field includes a scalar magnetometer surrounded by at least two conductor windings supplied continuously with currents from different generators. A processing circuit demodulates the signal supplied by the scalar magnetometer and supplies signals corresponding to the components of the field to be measured along the axes of the conductor windings.

7 Claims, 1 Drawing Sheet

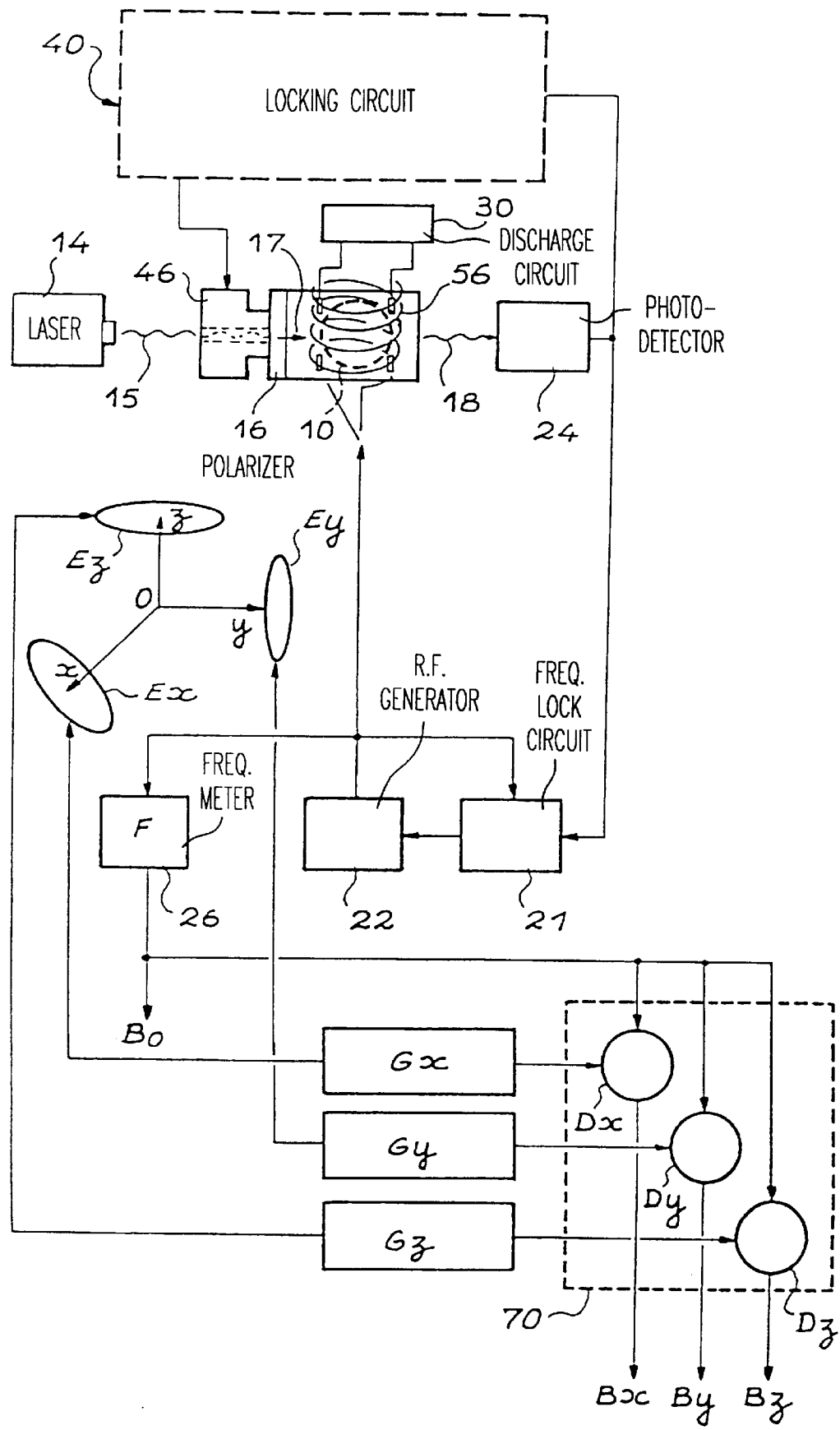

DEVICE FOR MEASURING COMPONENTS OF A MAGNETIC FIELD WITH THE AID OF A SCALAR MAGNETOMETER

TECHNICAL FIELD

The present invention relates to a device for measuring components of a magnetic field with the aid of a scalar magnetometer. It is used in the measurement of weak magnetic fields (approximately of the order of magnitude of the geomagnetic field, i.e. a few dozen microteslas).

PRIOR ART

For some years research has been carried out on the vectorial measurement of magnetic fields on the basis of intrinsically scalar magnetometers (i.e. sensitive solely to the modulus of the magnetic field and independently of its direction). The underlying idea of such research is to take advantage of the absolute character of scalar measurements (based on the resonance of protons (NMR) or electrons (EPR)) for obviating one of the major shortcomings of vectorial sensors, namely their offsets and associated, low frequency drifts.

Such a construction is e.g. described in FR-A-2 663 751 or the corresponding U.S. Pat. No. 5,221,897. These documents also contain bibliographical references on the subject.

However, these constructions are based on the sequential application of high amplitude polarization fields (generally well above the geomagnetic field). Therefore the magnetometer does not provide a continuous measurement, because it is necessary to take account on the one hand of the polarization field establishment time and on the other of the stabilization time of the measurement on the basis of which the projection of the magnetic field onto the artificially created field application axis is evaluated.

Thus, under these conditions, no anti-aliasing filtering is possible (to prevent the aliasing of the spectrum linked with the sampling) and also such a magnetometer is not adapted to rapidly variable fields, such as is the case during measurements on board satellites. Thus, there are variation rates of the modulus of the field of several dozen nT/s and several hundred or even thousand nT/s for certain components. In addition, for these applications, it is frequently necessary for the vectorial measurements to take place at a speed permitting an analysis band of at least 10 Hz or more in the vicinity of the poles (typically up to 25 Hz).

The object of the invention is to obviate these disadvantages.

DESCRIPTION OF THE INVENTION

To this end, the invention proposes a device for measuring components of a magnetic field using a scalar magnetometer, characterized in that it comprises:
  at least two conductor windings placed round said scalar magnetometer, said conductor windings having axes oriented in different directions,
  means for supplying each winding with a current having a given frequency individual to said windings,
  processing means receiving the output signal supplied by the scalar magnetometer, said means being able to carry out synchronous demodulations at least at the frequencies of the supply currents of the windings, said processing means supplying, for each frequency, a signal corresponding to the component of the magnetic field applied along the axis of the winding supplied at said frequency.

Preferably, the processing means are also able to carry out synchronous demodulations at harmonic frequencies or at the linear combination of the frequencies of the supply currents of the windings.

Preferably, the axes of the conductor windings are mutually orthogonal.

In an advantageous embodiment, the device comprises a first conductor winding with a first axis directed along a first direction and a second conductor winding with a second axis directed along a second direction orthogonal to the first. The processing means supply a first signal corresponding to a first component of the magnetic field in accordance with the first component of the magnetic field along the first direction and a second signal corresponding to a second component of the magnetic field along the second direction. The processing means are also able to calculate, on the basis of the signal supplied by the isotropic scalar magnetometer corresponding to the modulus of the magnetic field applied and on the basis of said first and second signals, a third signal corresponding to a third component of the magnetic field applied along a third direction orthogonal to the first and second directions.

In another embodiment, use is made of three conductor windings having mutually orthogonal axes and the device directly supplies the three components of the field.

In order to comply with the pass band constraints on the vectorial measurements, it is necessary to use a magnetometer, whose use frequency limitation is much higher than the pass bands necessary on vectorial measurements (useful pass band of a minimum of several hundred cycles) and whose scalar measurement resolution is at least two orders of magnitude higher than the precision required on the components of the field (a precision of 100 pT on vectorial measurements implies a scalar sensor resolution of 1 pT or higher).

For these reasons, use is preferably made of a scalar magnetometer with optical pumping using helium, like that described e.g. in FR-A-2 713 347 (or its corresponding U.S. Pat. No. 5,534,776).

BRIEF DESCRIPTION OF THE DRAWING

The single drawing illustrates an embodiment of a device according to the invention.

DESCRIPTION OF A SPECIFIC EMBODIMENT

The single drawing enclosed shows a scalar magnetometer with optical pumping using helium according to the already cited FR-A-2 713 347 (or its corresponding U.S. Pat. No. 5,534,776).

This magnetometer comprises a helium-filled cell 10, a laser 14 emitting a beam 15, a polarizer 16 supplying a rectilinearly polarized beam 17, a photodetector 24 receiving the beam 18 having traversed the cell, a frequency locking circuit 21, a radio frequency generator 22, a frequency meter 26 and a discharge circuit 30. The generator 22 supplies current to a coil 56 in the vicinity of the cell 10, in order to produce a radio frequency field in the latter. The coil 56 and polarizer 16 are mechanically joined, so that any rotation to the polarizer leads to a rotation by the same angle of the direction of the field, the intensity of the latter being defined by the generator 22. Advantageously, for linking the means 56 and 16, use is made of a rotary contact, e.g. a capacitive coupling contact or a transformer, whose primary winding is fixed and whose secondary winding is mobile.

Preferably, the coil and the polarizer are fitted in such a way that the polarization and field applied are parallel.

The circuit 40 is a locking circuit controlling a motor 46 regulating the angular position of the polarizer 16. This circuit is described in the cited document.

According to the invention and in the illustrated embodiment, the device also comprises three conductor windings Ex, Ey, Ez, whose axes form a coordinate trihedral Oxyz. For reasons of clarity, these windings are shown spaced from the cell 10 but, it must be understood that these windings in fact surround the cell 10. These windings are connected to three generators, respectiely Gx, Gy and Gz, each set to a particular frequency.

A processing circuit 70 comprises three demodulators Dx, Dy, Dz respectively connected to the generators Gx, Gy, Gz and receiving the output signal supplied by the scalar magnetometer, i.e. in the illustrated embodiment, the signal supplied by the frequency meter 26. This signal is generally a digital signal giving the modulus Bo of the field to be measured.

The application of an external field Hx applied along the axis Ox with a frequency Fx modifies the modulus of the field to be measured by a quantity varying at the frequency Fx. The output signal of the scalar magnetometer, which gives the modulus of the field, consequency contains a component varying at the frequency Fx and which is dependent on the projection of the field to be measured on the axis Ox. By demodulating the output signal of the scalar magnetometer at frequency Fx, access to said component is obtained and the same applies for the two other components.

The circuit 70 is of a conventional nature and can operate either by multiplication and demodulation, or by fast Fourier transformation (FFT). It supplies the components Bx, By, Bz of the field in three directions Ox, Oy, Oz.

The three components Bx, By, Bz of the field are linked with the modulus of the field Bo by the relation $$B_x^2 + B_y^2 + B_z^2 = B_0^2$$

Thus, it is also possible to only use two windings, e.g. Ex, Ey, two generators Gx, Gy and two demodulators Dx, Dy for obtaining the two components Bx and By and finding the third Bz on the basis of the continuous value Bo given by the frequency meter 26. The relation giving Bz is clearly:

$$|Bz| = [B_0^2 - B_x^2 - B_y^2]^{1/2}$$

Naturally, the embodiment described hereinbefore is only given in exemplified manner and it would be possible to use a different scalar magnetometer to that described, the essential point being that it provides an output signal reflecting the modulus of the field.

What is claimed is:

1. A device for measuring components of a magnetic field, comprising:

a scalar magnetometer configured to continuously supply an output signal corresponding to a modulus of the magnetic field to be measured;

at least two conductor windings placed around said scalar magnetometer, said conductor windings having axes oriented in different directions;

at least two generators, each of said at least two generators being configured to continuously supply a current to one of said at least two conductor windings, said current having a frequency specific to said one of said at least two conductor windings; and a processing circuit configured to receive said output signal supplied by said scalar magnetometer, wherein said processing circuit comprises at least two synchronous demodulators, each of said at least two synchronous demodulators being configured to demodulate said output signal and to continuously supply a signal corresponding to a component of said magnetic field to be measured along an axis of one of said at least two conductor windings.

2. A device according to claim 1, wherein each of said at least two synchronous demodulators is configured to demodulate said output signal at a frequency of a current supplied to one of said at least two conductor windings.

3. A device according to claim 1, wherein said processing circuit is configured to synchronously demodulate said output signal at harmonic frequencies, or at a linear combination of frequencies, of currents supplied by said at least two generators.

4. A device according to claim 1, comprising:

a first conductor winding having a first axis directed in a first direction;

a second conductor winding having a second axis directed in a second direction orthogonal to the first direction;

said processing circuit being configured to supply a first signal corresponding to a first component of the magnetic field to be measured in said first direction and a second signal corresponding to a second component of the magnetic field to be measured in said second direction; and means for calculating, based on said output signal supplied by said scalar magnetometer and on said first and second signals, a third signal corresponding to a third component of said magnetic field to be measured in a third direction orthogonal to said first and said second directions.

5. A device according to claim 1, comprising two conductor windings having mutually orthogonal axes and two generators configured to supply said two conductor windings.

6. A device according to claim 1, comprising three conductor windings having mutually orthogonal axes, and three generators configured to supply said three conductor windings.

7. A device according to claim 1, wherein said scalar magnetometer comprises optical pumping means including a helium cell.

* * * * *